(12) United States Patent
Yankowitz

(10) Patent No.: US 12,149,095 B2
(45) Date of Patent: Nov. 19, 2024

(54) PARALLEL TUNED AMPLIFIERS

(71) Applicant: Yank Technologies, Inc., Brooklyn, NY (US)

(72) Inventor: Joshua Aaron Yankowitz, Brooklyn, NY (US)

(73) Assignee: Yank Technologies, Inc, Brooklyn, NY (US)

( * ) Notice: Subject to any disclaimer, the term of this patent is extended or adjusted under 35 U.S.C. 154(b) by 659 days.

(21) Appl. No.: 17/278,255

(22) PCT Filed: Sep. 26, 2019

(86) PCT No.: PCT/US2019/053266
§ 371 (c)(1),
(2) Date: Mar. 19, 2021

(87) PCT Pub. No.: WO2020/069198
PCT Pub. Date: Apr. 2, 2020

(65) Prior Publication Data
US 2021/0359551 A1 Nov. 18, 2021

Related U.S. Application Data

(60) Provisional application No. 62/736,843, filed on Sep. 26, 2018.

(51) Int. Cl.
*H02J 50/12* (2016.01)
*H02J 7/02* (2016.01)
*H03F 3/45* (2006.01)

(52) U.S. Cl.
CPC .......... *H02J 50/12* (2016.02); *H02J 7/02* (2013.01); *H03F 3/45475* (2013.01)

(58) Field of Classification Search
CPC ..................................................... H02J 50/12
(Continued)

(56) References Cited

U.S. PATENT DOCUMENTS

2009/0130997 A1* 5/2009 Gauthier .......... H03H 7/40
455/124
2010/0253310 A1 10/2010 Fonderie
(Continued)

FOREIGN PATENT DOCUMENTS

JP 2017-046417 3/2017
JP 2017046417 A * 3/2017
(Continued)

OTHER PUBLICATIONS

Office Action for Co-Pending Japanese Patent Application No. 2021-517008, mail date: Jun. 20, 2023. 11 pages with unofficial translation.
(Continued)

*Primary Examiner* — Edward Tso
*Assistant Examiner* — Ahmed H Omar
(74) *Attorney, Agent, or Firm* — Perkins Coie LLP

(57) ABSTRACT

The disclosed technology provides a system for transmitting wireless power for charging electronic devices, e.g., smartphones, medical appliances, industrial equipment, and robotics. Some embodiments include parallel tuned resonant LC networks, load networks, and impedance matching networks for Class D and E, single-ended or differential, amplifier topologies for wireless power transfer in resonant inductive systems.

19 Claims, 6 Drawing Sheets

(58) Field of Classification Search
USPC ........................................................ 320/108
See application file for complete search history.

(56) References Cited

U.S. PATENT DOCUMENTS

| | | | |
|---|---|---|---|
| 2013/0135050 A1 | 5/2013 | Cercelaru | |
| 2014/0312969 A1 | 10/2014 | Hamond | |
| 2015/0207334 A1 | 7/2015 | Mitcheson et al. | |
| 2016/0087481 A1 | 3/2016 | Jiang et al. | |
| 2016/0226299 A1 | 8/2016 | Nam et al. | |
| 2017/0063162 A1* | 3/2017 | Nishikawa | H02J 50/12 |
| 2017/0317529 A1* | 11/2017 | Smith | H02J 50/80 |
| 2019/0190319 A1* | 6/2019 | Kawamae | H02M 7/46 |

FOREIGN PATENT DOCUMENTS

| | | |
|---|---|---|
| JP | 2017-0931080 | 5/2017 |
| KR | 10-2013-0094033 | 8/2013 |
| KR | 2013-0094033 A | 8/2013 |
| KR | 10-1631669 B1 | 6/2016 |

OTHER PUBLICATIONS

European Extended Search Report for EP Appl. No. 19867723, dated Oct. 12, 2021, 11 pages.
First Examination Report for co-pending Indian Patent Application No. 202147017138, dated Oct. 12, 2022, 6 pages.
PCT Search Report and Written Opinion, PCT Appl. No. PCT/US2019/053266, dated Jan. 15, 2020, 10 pages.
IPO, First Examination Report for Indian Patent Application No. 202147014727, mail date: Oct. 13, 2022. 5 pages.
Office Action for Co-Pending Canadian Patent Application No. 3,112,046, mail date: Nov. 28, 2023. 4 pages.
Article 94 for Co-Pending European Patent Application No. 19867723.9, mail date: Dec. 1, 2023. 19 pages.
Grebennikov, et al. "Class E With Parallel Circuit—A New Challenge for High-Efficiency RF and Microwave Power Amplifier" TH2D-1, 0-7803-7239-5/02, 2002 IEEE Piscataway NJ, Cat. No. 02CH37278, 4 pages.
First Examination Report for Co-Pending Indian Patent Application No. 202147014727, mail date: Oct. 13, 2022. 5 pages.
Examination Report No. 1 for Co-Pending Australian Patent Application No. 2019346612, mail date: Mar. 6, 2024. 4 pages.
JPO, Decision to Grant a Patent for Japanese Application No. 2021-517008, mailed on Jan. 23, 2024, 5 pages with English translation.
Office Action for Co-Pending Korean Patent Application No. 10-2021-7009371, mail date: Jun. 26, 2024. 14 pages with machine translation.
Communication under Rule 71(3) EPC Co-Pending European Patent Application No. 19 867 723.9, mail date: Jul. 22, 2024. 6 pages.

* cited by examiner

PARALLEL TUNED AMPLIFIERS

CROSS-REFERENCE TO RELATED APPLICATIONS

The present document claims priority to U.S. Provisional Patent Application No. 62/736,843, entitled "PARALLEL TUNED AMPLIFIERS," filed on Sep. 26, 2018, which is incorporated herein by reference in its entirety.

BACKGROUND

The number of devices that use rechargeable power source is ever increasing. To solve the operational issues associated with wired power charging solutions, in the recent years, wireless charging technology has been introduced and being used primarily for recharging mobile phones. In the next few years, the use of wireless charging is expected to increase even more for an even wider range of electronic devices.

DETAILED DESCRIPTION

Figure 1:
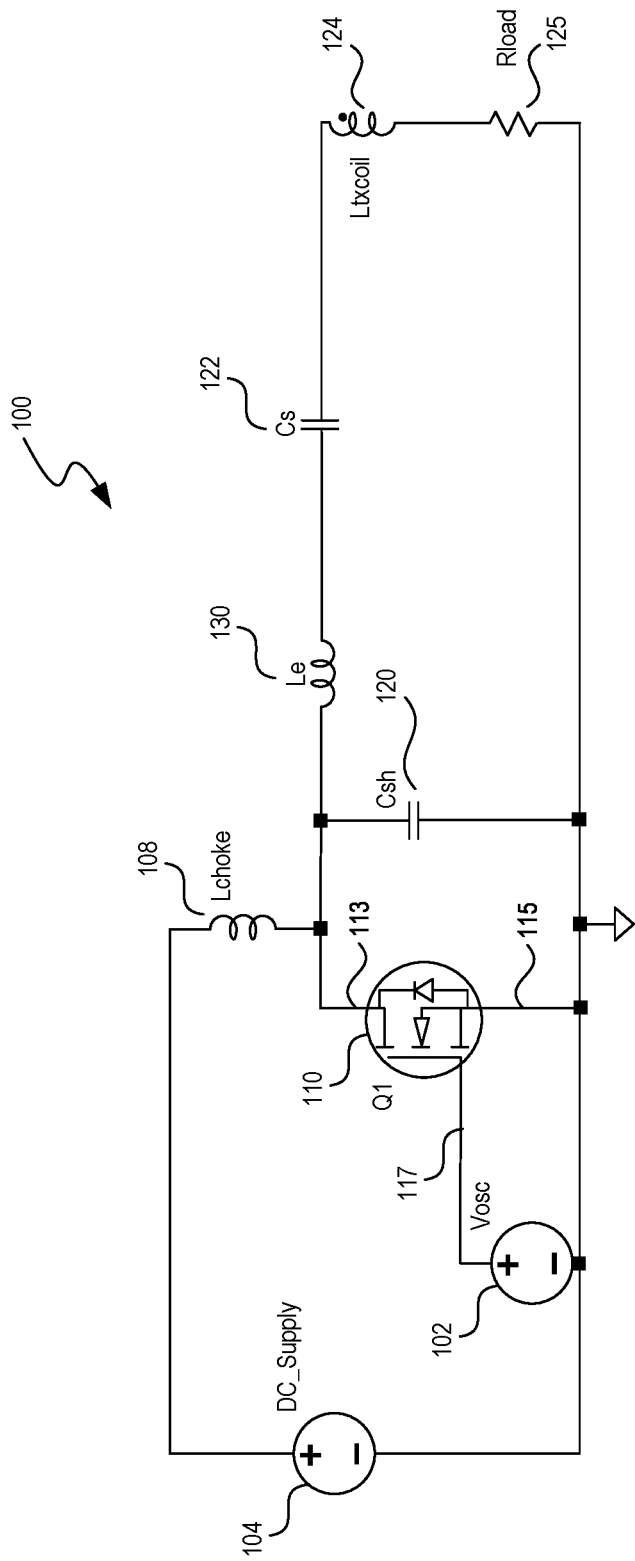
FIG. 1 shows a representative schematic of a conventional single-ended class E amplifier for a resonant inductive wireless charging system.

Wireless charging systems use an electromagnetic field to transfer energy between two or more inductively coupled devices. For example, one of the devices can be a transmitter device such as a charging station or platform that generates the electromagnetic field used to transmit power by amplifying a signal, and the other device can be a receiver device to receive the electromagnetic energy through resonant inductive coupling, and convert the received electromagnetic energy to electrical energy to operate the receiver device or charge its power supply.

Resonant inductive technology based on inductive coils has been adapted to attain substantial power efficiency (e.g., above 80%) across mid-range distances such as distances two, three, or even four times the coil diameters for high quality ("Q") antennas (i.e., antennas with high inductive reactance relative to their resistance). The intrinsic Q of an antenna is the measure of the energy dissipated in the antenna relative to the energy stored in the antenna and is a barometer for the efficiency of the antenna. The higher the Q, the better the antennas can couple electromagnetic fields, which can result to a higher power delivery to a load. Inductive coils can be designed to generate electromagnetic fields capable of traveling through objects in various frequency ranges including the International, Scientific, and Medical (ISM) bands, such as 6.78 MHz and 13.56 MHz, with Specific Absorption Rates (SAR) and electric fields lower than FCC regulations, and at power levels in even the kilowatt (kW) range. To maintain high system efficiencies, wireless charging systems based on resonant inductive technology need to be driven by very efficient amplifier topologies, such as Class D or Class E amplifiers. However, because of limitations in current amplifier designs, current wireless charging systems are limited to short inductive coupling distances where the wireless charging transmitter and receiver devices are strongly electromagnetically coupled.

Techniques, systems, and devices are described in the present document that can be used, for example, for providing wireless power transmission for charging electronic devices, e.g., smartphones, medical devices, industrial equipment, and robotics (e.g., microbotics). One example embodiment of the disclosed technology includes transmitter parallel tuned resonant LC networks, load networks, and impedance matching networks for Class D and E amplifier topologies, single-ended or differential, configured to improve wireless power transfer for resonant inductive systems.

In some example implementations, the disclosed technology provides a wireless charging system to include a power source electrically coupled to a transmitter antenna or antenna array to produce an electromagnetic field. The transmitter device includes a switching power amplifier such as a Class D or Class E amplifier circuit, either in single-ended or differential-mode, to draw power from a power source. The load network and matching network are tuned such that the transmitter antenna is in parallel rather than series to the resonant capacitor with the load network of the amplifier also tuned at the same corresponding resonant frequency. The LC tank is tuned so that the entire system operates completely in resonance rather than using an off-resonant load network. This way, the voltage across the transmitter coil(s) is maximized and harmonics are reduced. By maximizing the voltage of the LC tank, there is higher oscillating current flowing through the transmitter antenna or a stronger magnetic field to be coupled with the receiver, especially in a loose coupling resonant inductive system, such as when the transmitter and receiver are physically far apart. In some embodiments, a transformer can also be included to further increase the oscillating voltage across the transmitter antenna and thereby further improve the flux linkage and power delivery between the transmitter and receiver(s). Furthermore, by having a parallel resonant LC tank, the amplifier is better protected from movements or changes in the position of the receiver or capacitive and inductive reflections from the surrounding environment that could cause a dramatic change in the efficiency of the amplifier or may irreparably damage it.

The practical realization of efficient amplifier topologies like Class E and D for wireless charging systems is difficult because they tend to be sensitive to changes in load impedance. If the impedance is even a few ohms different than the designed value or if there is slightly more reactance or slightly less reactance than the designed value, the system efficiency can drop dramatically because the amplifiers' voltage and current waveforms become more in-phase, creating power losses. Furthermore, as the waveforms become more in-phase, the likelihood of irreparably damaging the amplifiers increases due to voltage or current spikes over components, such as the switching transistor.

For high 'Q' resonant inductive systems, impedance mismatches and resonant frequency shifts become more problematic, creating substantial power losses in the wireless charging system. For a transmitter or receiver antenna with high Q, the bandwidth is very narrow. For example, with an antenna with a Q of ~500, the bandwidth is less than 10 kHz, so more than 50% of the power could be lost if delivered at more than 10 kHz away from the resonant frequency. Furthermore, if the receiver moves closer to the transmitter, then the reflected impedance increases because the transmitter and receiver couple better. If the amplifier's load network is designed to drive the reflected impedance of the receiver, then this can cause the current and voltage waveforms to overlap and create either enormous losses in the system or irreparably damage it. Conversely, if the receiver moves further away from the transmitter, then the reflected impedance approaches zero. If the amplifier's load network again is designed to drive the reflected impedance of the receiver, this would be effectively driving an open load and could irreparably damage the amplifier. As the Q of the antennas increase at resonance, the coupling increases so while there can be more power delivered to the load, there is also a greater potential variation in reflected impedance, which makes driving a high Q system with these amplifiers even more difficult. In addition, there can be objects in the nearby environment that induce an inductive or capacitive reflection to the amplifier, which can potentially damage the amplifier or dramatically reduce its system efficiency. This potential change in reflections to the transmitter creates significant challenges for the design of a Class E and Class D amplifier topologies, especially for wireless charging systems.

This challenge is also present for a differential-mode Class E amplifier where the gate driver provides a square wave or pulse to the gate of two transistors in a push-pull configuration rather than a single switching transistor to reduce the voltage and power dissipated across each individual transistor and increase the total power delivered. Because the differential-mode Class E system optimizes zero-voltage-switching (ZVS) across the transistors, it is still very sensitive to any potential change in reflections, whether real or reactive. The same is true for Class D amplifier topologies and any other amplifier topologies that attempt to minimize the overlap of current and voltage waveforms across the switching components in the amplifier.

Due to these and other technical issues in amplifier technology, various commercial charging products based on resonant inductive technology (e.g., inductive charging pads) have been limited in certain aspects. Some existing inductive charging pads are configured as thin matt-like objects that charge electronic devices when placed on the pad. These products have very limited charging distances, e.g., normally within the range of several centimeters (e.g., less than 2 to 5 cm) because of these engineering challenges.

Resonant inductive wireless charging systems today use series resonant tuning to cancel the inductive reactance of the transmitter coil. Additionally, the receiver's inductive reactance is cancelled by a corresponding series capacitor(s) at the same resonant frequency. Thus, the amplifier "sees" the real impedance from the receiver when the receiver or receivers are placed in close physical proximity to the transmitter. These amplifiers are typically designed to be tuned off-resonant with a wide impedance range to adjust to variations in reflected impedance from a movement of receivers, introduction of new receivers, or capacitive/inductive reflections from the surrounding environment, for example. However, by tuning the transmitter off-resonant, the amount of power potentially delivered to the receiver is diminished, especially as the receiver or receivers move physically further away from the transmitter because the coupling will be more profoundly decreased at a distance for an off-resonant system. This issue is even more notable for transmitter and receiver antennas with high Q that have much tighter bandwidths like previously described. If the wireless charging system is designed to operate off-resonant, it limits the design optimization of the transmitter and receiver antennas. This is because if the antennas have too high of a Q, there is a greater potential variation in impedance due to stronger coupling. Because this amplifier is very sensitive to changes in reflected impedance, this can potentially damage the amplifier or dramatically reduce system efficiency. Furthermore, the off-resonant load network of the amplifier may shift the resonant frequency of the transmitter antenna. With a very high Q antenna, this can result in losses if the operational frequency differs from the resonant frequency of the resonating transmitter antenna.

Various embodiments of amplifier circuits are described in the present document. The present description provides specific details for a thorough understanding and an enabling description of these embodiments. One skilled in the art will understand, however, that the described techniques can be practiced without many of these details. Additionally, some well-known schematic topologies may not be shown or described in detail, to avoid unnecessarily obscuring the relevant description of the various embodiments. The terminology used in the description presented below is intended to be interpreted in its broadest reasonable manner, even though it is being used in conjunction with a detailed description of certain specific embodiments.

FIG. 1 shows a representative schematic of a conventional single-ended class E amplifier 100 for a resonant inductive wireless charging system. In amplifier 100, a transistor 110 acts like a switch connecting the transistor's drain node 113 to the transistor's source node 115 when a gate voltage at the transistor's gate node 117 is above the threshold voltage of transistor 110. That is, the switch implemented by transistor 110 "closes" when the gate node 117 is positive, allowing current to flow from the drain node 113 to the source node 115. When gate node 115 is at ground (or below transistor 110's threshold voltage), the switch implemented by transistor 110 "opens" blocking a current flow from drain node 113 to source node 115.

A load network for the amplifier 100, composed of shunt capacitor (Csh) 120, RF choke (Lchoke) 108, and extra inductor (Le) 130, is tuned such that current and voltage waveforms are out-of-phase from one another, resulting in zero-voltage-switching (ZVS) of transistor 110 which greatly reduces the power dissipated across the transistor 110. When the load network is properly tuned, the voltage across transistor 110 is minimized when the switch is "closed" and the current across the transistor 110 is minimized when the switch is "open." This improves the power efficiency of amplifier 100 to more than 90% efficiency, making such class E amplifier topologies suitable for wireless power transfer.

In amplifier 100, an oscillator and gate driver integrated circuit (Vosc) 102 can supply a square wave pulse at the desired resonant frequency. The square wave pulse is applied to the gate node 117 of transistor 110. The square wave can be adjusted with dead-time circuitry, such as a diode and resistor, to better tune and adjust the ZVS waveforms described above by controlling the rise and fall time of the square wave. Choke inductor (Lchoke) 108 is an RF choke to protect the dc supply 104 by filtering out high frequency signals from reaching dc supply 104, and is selected along with the shunt capacitor (Csh) 120 and the extra inductor (Le) 130 to create ZVS across the switching transistor 110. The value of the series resonant capacitor (Cs) 122 is selected to cancel, at the desired resonant frequency, the reactance of the transmitter antenna represented by the serious inductor (Ltxcoil) 124. A load resistor (Rload) 106 represents the reflected impedance received by a receiver device placed near a transmitter device containing amplifier 100. On the receiver device, a receiver antenna and series resonant capacitor (not shown in FIG. 1) cancel each other's reactance, such that the reflected impedance to the transmitter device is the load of the receiver device or Rload (e.g., 30 Ohms). For example, if Vosc 102 applied a pulse with frequency 6.78 MHz, the resonant frequency of the LC tank (comprising Cs and Ltxcoil) can be tuned to 6.78 MHz, Cs can be selected to be 66.4 pf, and Ltxcoil can be selected to be 8.3 µH. Lchoke can be selected to be high inductance such as 100 uH to protect the DC supply 104. Cs can be selected to be 50 pF and Le to be 1000 nH to set the voltage and current waveforms for zero current switching.

There are several issues with the topology of amplifier 100. For example, when the receiver device is not near the transmitter device to induce a real reflected impedance, there is no load to deliver the power to (i.e., Rload is 0), which results in an open circuit. As a result, power would be dissipated through the components of the transmitter device, creating a large power loss which can irreparably damage the amplifier 100. To compensate for this, inductive charging pads can add circuitry to increase the impedance range of the amplifier 100, and reduce the current drawn from the amplifier 100 when the receiver device is not present, thereby preventing damage to the transmitter components. However, such additional circuitry increase the cost of developing, prototyping, and manufacturing amplifiers for wireless charging systems.

Another issue is that the amplifier 100 is extremely sensitive to changes in both real and reactive reflections. Even with an increase in operating impedance range with the use of additional circuitry as discussed above, the amplifier's ZVS is highly affected by inductive or capacitive reflections. Even though series capacitor (Cs) 122 and series inductor (Ltcoil) 124 are tuned to the desired resonant frequency, the resonant LC tank (Cs and Ltxcoil) is directly connected to the off-resonant network comprising the choke inductor (Lchoke) 108, the shunt capacitor (Csh) 120, and extra inductor (Le) 130. With no isolation between the off-resonant network and the resonant LC tank network, an inductive or capacitive reflection can cause the ZVS waveforms to dramatically shift because the value of the series capacitor (Cs) 122 is typically selected to completely cancel out the reactance of the series inductor (Ltxcoil) 124. That is, a capacitive or inductive reflection can directly alter the amplifiers switching waveforms where the reactance of Cs and Ltxcoil completely cancel each other out. An inductive or capacitive reflection can be from, for example, the introduction of receiver devices that do not have their reactances completely tuned at resonance, a change in the position of receiver devices relative to a paired transmitter, or from objects in the surrounding environment that can induce a capacitive or inductive reflection. The shift in ZVS can cause additional harmonics, decrease the amplifier's system efficiency, and/or irreparably damage the amplifier 100.

Because of the issues identified above, the conventional amplifier 100, is not suitable for a loosely coupled wireless charging system, only for strongly coupled wireless charging systems such as a wireless charging pads. For a wireless charging pad, the transmitter and receiver devices are placed near each other in a repeatedly predictable or predetermined distance and orientation, typically within a few millimeters, so they strongly couple. In a loose coupling system, where the transmitter and receiver are physically far apart and/or oriented such that the electromagnetic wave generated by the transmitter is not strongly coupled by the receiver, the real reflected impedance or Rload can be very small. Such a low Rload value can be inefficient for the amplifier to deliver power to, or can lead to damage to the amplifier. Furthermore, an appropriate design value for Rload can be difficult to predict where, for example, a user can place a receiving device at different distances or orientations relative to the transmitter. For example, when the receiver device is moved physically closer to the transmitter device, a resulting increase in mutual inductance can shift the ZVS waveforms because there is no isolation between the off-resonant load network and the resonant LC tank network as described above. Conversely, when the receiver device is physically moved further away from the transmitter device, a resulting decrease in mutual inductance can also cause a shift in the ZVS waveforms. The movement of the transmitter and receiver(s) towards or away from each other or a change in coupling can cause reflections to the amplifier that shift its ZVS waveforms. Therefore, while amplifier 100 is often used, it is not robust, is highly sensitive, and results in poor performance for a loose coupling wireless charging system application.

Because loosely coupled systems as described above could lead to damage of the amplifier or a drastic drop in power efficiency, wireless charging pads using such a conventional amplifier 100 are typically suitable for only charging devices very close to the charging pads. Even where the distance between a transmitter device and a loosely coupled receiver device is fixed, for example, where an electric vehicle wireless charging pad is loosely coupled with a receiver installed in the vehicle, the angular alignment between the charging pad and the in-vehicle receiver can vary, for example, when the vehicle is parked at different angles above the charging pad. This variation in angular alignment can in turn shift the ZVS waveforms of amplifier 100 as described above because a change in the angle results in a change in coupling. A more robust and less sensitive amplifier design is therefore needed for higher efficiency, longer range wireless charging systems.

Figure 2:
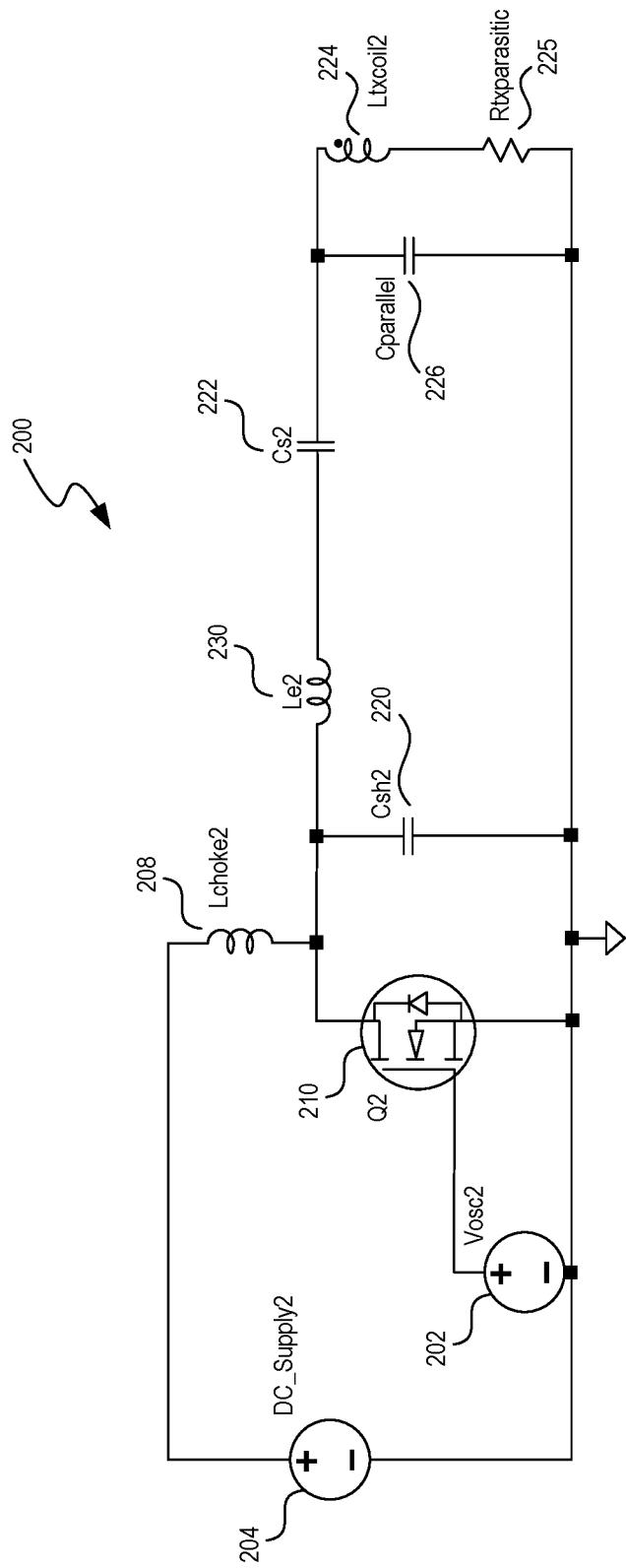
FIG. 2 shows a representative schematic of a single-ended class E amplifier with a parallel tuned resonant network.

FIG. 2 shows a representative schematic of a single-ended Class E amplifier 200 with a parallel tuned resonant network. In FIG. 2, an oscillator and gate driver integrated circuit (Vosc2) 202 can generate a signal (e.g., a square wave) at a desired resonant frequency. The signal is applied to the gate of a transistor 210. In some embodiments, the signal can be generated by a gate driver and oscillator integrated circuit, and can be adjusted with dead-time circuitry (not shown in FIG. 2), such as a diode and resistor, to better tune and adjust current and voltage waveforms of amplifier 200 for ZVS. Amplifier 200 can also include a choke inductor (Lchoke2) 208 to protect the dc supply 204, a shunt capacitor (Csh2) 220, and an extra series inductor (Le2) 230.

Unlike the amplifier 100 of FIG. 1, the amplifier 200 of FIG. 2 has a series capacitor (CS2) 222 to tune out the inductive reactance of the extra inductor (Le2) 230 at the desired resonant frequency of the signal generated by Vosc2 202 rather than cancel the inductive reactance of the transmitter antenna (Ltxcoil2). The series capacitor (CS2) 222 together with Le2 230 act as a series resonant filter, making the design more robust by reducing harmonics. Amplifier 200 also includes a parallel capacitor (Cparallel) 226 placed in parallel to the transmitter antenna (e.g., a transmitter coil) represented by an inductance Ltxcoil 224 and a parasitic resistance Rtxparasitic 225. Because the parallel capacitor (Cparallel) 226 excites the transmitter antenna, a transmitter device containing amplifier 200 is not dependent on a reflected real impedance of a receiver device for efficient operation as is a transmitter device containing amplifier 100 of FIG. 1 as discussed above.

Resonant inductive coupling can be conceptually compared to a single-phase transformer except that, in the wireless charging system, the primary and secondary windings of the conceptual transformer are placed away from each other rather than being tightly wound on a core. The Q of the wireless charging system's transmitter and receiver antennas (or the efficiency of the conceptual primary and secondary transformer coils) increases at resonance to increase the magnetic coupling to compensate for the physical separation of the windings. Based on this analogy, amplifier 100 (FIG. 1) can be compared to a current transformer or a series transformer. Conversely, amplifier 200 (FIG. 2), can be compared to a voltage/potential transformer or parallel transformer. In a series or current transformer, the transformer can become irreparably damaged when there is an open circuit. On the other hand, in a parallel or voltage/potential transformer, the transformer can become irreparably damaged when there is a short circuit. As discussed above, in a wireless charging system utilizing amplifier 100 of FIG. 1, when the transmitter device and receiver device are loosely coupled (e.g., by being moved further apart), an open load or near open load condition can result which can damage amplifier 100 (of FIG. 1). On the other hand, the amplifier 200 of FIG. 2 includes a high impedance resonating LC tank with a load network fixed at a desired impedance at resonance and is thereby operational when the receiver load is not present by, for example, changes in the relative position or orientation of the transmitter and receiver devices. That is, returning to the comparison with a potential transformer, loosely coupling a wireless charging system utilizing amplifier 200 is not damaged under an open-load condition and a short circuit condition in amplifier 200 will not practically occur (unless the transmitter device were physically altered or impacted).

In amplifier 200, the load network components comprising the choke inductor (Lchoke2) 208, the shunt capacitor (Csh2) 220, and the extra series inductor (Le2) 230 are configured to set the current and voltage waveforms out of phase thereby achieving ZVS. However, unlike in amplifier 100 (FIG. 1), rather than selecting a very high inductance choke inductor, Lchoke2's inductance value is selected to cancel out (at the desired resonant frequency and the signal generated by Vosc2 202) the parasitic capacitance of the switching transistor 210, the shunt capacitance (Csh2) 220, as well as other parasitic capacitances such from a printed circuit board (PCB) on which amplifier 200 is implemented. This results in less harmonics and a more robust amplifier. Additionally, the capacitance of the series capacitor (Cs2) 222 is selected to cancel out the inductive reactance of series inductor (Le2) 230 at the desired resonant frequency, as well as to form a series resonant filter which further reduces the power in the harmonics. The capacitance of the parallel capacitor (Cparallel) 226 is then selected to cancel out the reactance of an antenna (represented by Ltxcoil2 224) at the desired resonant frequency. For example, in some embodiments, Csh2 220 can be selected to be 158 pF, Le2 230 can be selected to be 7 µH, Cs2 222 can be selected to be 78.7 pF, Cparallel 226 can be selected to be 551 pF, and Lchoke2 208 can be selected to be 600 nH for an amplifier 200 with an antenna with an inductance 224 of 1 µH and a series parasitic resistance 225 of 0.1 Ohms. Vosc 202 can generate a 6.78 MHz square wave alternating between 0 and 5V to drive the gate of the switching transistor 210, where the switching transistor contributes a parasitic capacitance of 760 pF. A 20 V dc supply 204 can drive the drain of the switching transistor 210 through the choke inductor Lchoke. From the variables in this example, the resonant frequency of the load network and LC tank is the same as the operating frequency of 6.78 MHz generated by Vosc 202. That is, the periodic signal applied to the switching transistor Q2 210 is the same frequency that substantially resonates the choke inductor Lchoke2 208 and the parasitic capacitance of the switching transistor (not shown in FIG. 2) as well as its shunt capacitor (Csh2 220), the series inductor (Le2 230) and series capacitor (Cs2 222), and the transmitter antenna (represented by Ltxcoil2 224 and Rtxparasitic 225) and parallel capacitor (Cparallel 226). That is, the passive components identified above (Lchoke2, parasitic capacitance (Cparasitic), Csh2, Le2, Cs2, Ltxcoil, Rtxparasitic, Cparallel) resonate at or around the fundamental frequency of the input periodic signal generated by Vosc 202.

Amplifier 200's load network is configured to improve power efficiency (e.g., by reducing spurious harmonics and intermodulation components), and is robust to reflections because it is better isolated from the LC tank than amplifier 100 (of FIG. 1). In some embodiments, dc supply 204 can be protected from high frequency signals in amplifier 200 by a separate external filter, for example an electromagnetic compatibility (EMC) filter (not shown in FIG. 2), rather than by the inductor choke (Lchoke2) 208. In this way, Lchoke 208 can be configured to operate at resonance with the load network rather than as a high frequency block protecting dc supply 204. By having a high impedance LC tank and high isolation to the load network, the amplifier 200 operates efficiently substantially independent from the reflected impedance of a receiver device. That is, amplifier 200 when integrated in a transmitter device can operate under a "no receiver" or "open load" condition without substantial power losses or without being irreparably damaged. This is because, with the parallel resonant topology of amplifier 200, the amplifier draws more current from the dc supply 204 when coupled to a receiver, and otherwise, very little power is dissipated across the parasitic resistance of the transmitter antenna Rtxparasitic 225. In a loosely coupled wireless charging system where the reflected impedance may only be a few ohms, a transmitter device integrating amplifier 200 can effectively deliver power to a receiver device which would not be the case in a transmitter device integrating amplifier 100 of FIG. 1.

In some embodiments, amplifier 100 can be reconfigured to improve stability for a loose coupling system by driving a conjugate matched transmitter antenna. This system is not as efficient nor as stable as the disclosed technology in amplifier 200, but can be connected to a series resonant amplifier like described in amplifier 100 to make it operational when the receiver is not present or when very little coupling occurs between transmitter and receiver so the amplifier is not irreparably damaged. In these embodiments, the load network can be off-resonant like in amplifier 200 with Lchoke2 208 being selected with a high inductance value (e.g., 100 µH) to protect the dc supply 204; Csh2 220 (e.g., 50 pF) and Le2 230 (e.g., 1 µH) can be selected to tune the ZVS waveforms, and are not tuned at the resonant frequency of the LC tank and the pulse applied by Vosc2. Cs2 222 can be approximately 70 pF and Cparallel 226 can be approximately 480 pF for an antenna with an inductance Ltxcoil2 224 of 1 µH and a series parasitic resistance Rtxparasitic 225 of 0.1 Ohms to set the impedance seen by the amplifier to be approximately 6 Ohms. The load network of the amplifier 100 can be expensive and/or difficult to redesign at resonance, which better protects the amplifier and reduces harmonics. Instead, a conjugate matched transmitter antenna can be connected directly to the load network at a predefined impedance value that amplifier 100 is capable of driving, such as 5 ohms. In some embodiments, a series resonant filter, bandpass filter, or transformer can be placed between the load network and the conjugate matched transmitter antenna, although this can impact the ZVS tuning of the load network and may diminish the benefit derived from connecting the conjugate matched antenna to an embodiment of amplifier 100. Instead of selecting the capacitance value of Cs2 222 and Cparallel 226 to tune out the reactance of Ltxcoil2 224 in purely parallel or series, the capacitance values are selected based on an impedance value desired by the embodiment of amplifier 100. For example, if a desired design point of the amplifier is driving approximately 30-ohm load, then Ltxcoil2 can be tuned to a 30-ohm impedance using a Smith Chart by placing a parallel and series capacitor to Ltxcoil2 at the desired resonant frequency. One difficulty with these embodiments employing this topology is that they can require additional modifications to the receiver because the frequency seen by the amplifier in reflection mode using equipment such as Vector Network Analyzers (VNA) can be different than the frequency seen in transmission mode by the receiver. This system can operate better with an antenna with higher bandwidth or lower Q given that Ltxcoil2 may be off-resonant in order to reach a middle ground or a design point where the amplifier can safely drive the conjugate matched antenna and where the receiver requires minimal modifications to its corresponding resonant frequency. However, the Q of the transmitter antenna should not be too low because doing so can increase the overall losses in the system. Additionally, the selection of Cs2 220 capacitance value in these embodiments is significant because a low capacitance may produce a better conjugate match to the amplifier, but it also may in turn induce a high voltage across the capacitor Cs2 220.

Figure 3:
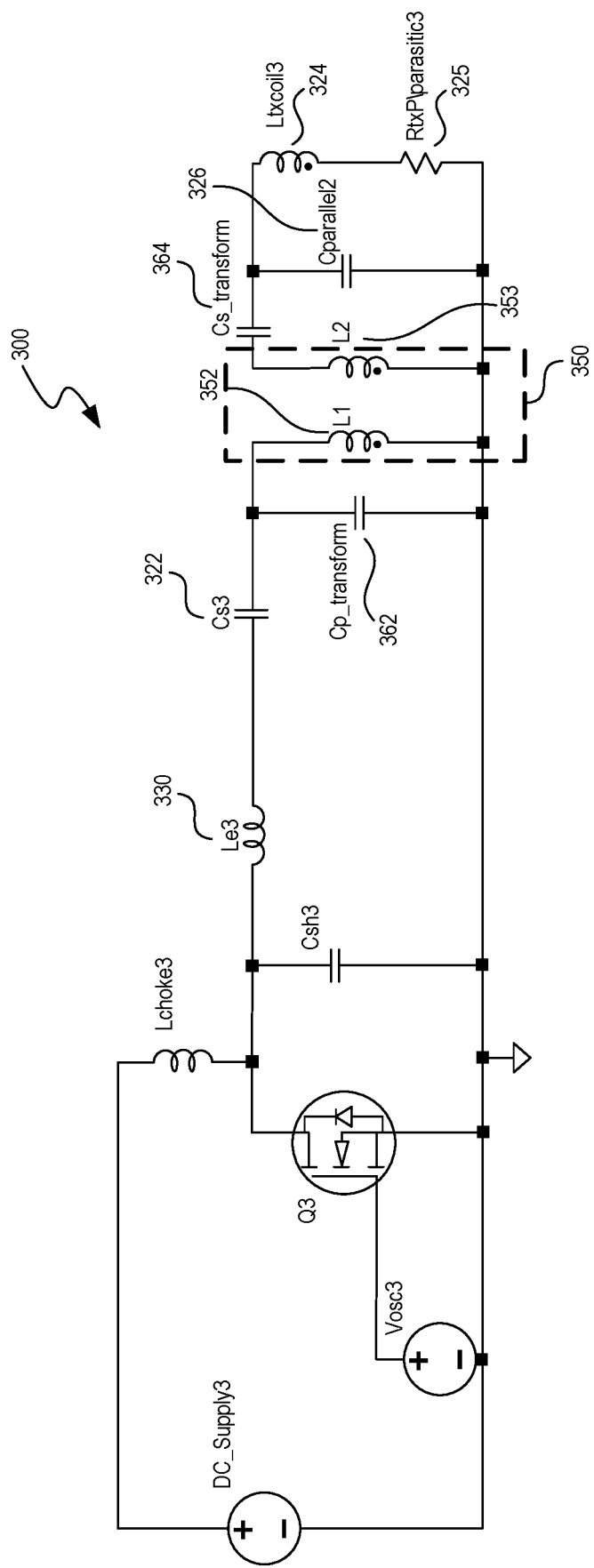
FIG. 3 shows a representative schematic of a parallel tuned class E amplifier with a step-up transformer.

FIG. 3 shows a representative schematic of a class E amplifier 300 with a step-up transformer 350 between the series LC filter (Le3 330 and Cs3 322) and the LC tank of the transmitter antenna, where the LC tank comprises Cparallel2 226 in parallel with an antenna having an inductance Ltxcoil3 324 and a series equivalent resistance Rtxparasitic3 325. Inductor L1 352 and inductor L2 353 represent the primary and secondary windings (respectively) of step-up transformer 350. In some embodiments, the transformer can be a 1:3 step-up transformer, with the transformer's turn ratio directly proportional to the voltage ratio (i.e., a transformer with a 1:N turns ratio also has a 1:N voltage ratio).

The step-up transformer 350 can increase the voltage across the main transmitter coil and can also reduce the reflections that the amplifier 300 "sees", further improving the stability of the amplifier 300 by better isolating the amplifier 300 from the LC tank. In general, the higher the oscillating voltage induced across a transmitter antenna, the higher the oscillating current or magnetic field strength generated by the transmitter antenna. For a wireless charging system based on resonant inductive coupling, the stronger the magnetic field, the greater the magnetic flux linkage between the transmitter antenna and the receiver antenna and hence the more power delivered to the receiver device from the transmitter device.

Like the amplifier 200 of FIG. 2, amplifier 300's load network is configured to achieve ZVS and for resonance at the desired resonant frequency. However, amplifier 300 includes a capacitor Cp_transform 362 selected to tune out the reactance of the primary inductor winding L1 352 at the desired resonant frequency, and a capacitor Cs_transform 364 selected to tune out the reactance of the secondary inductor winding L2 353 at the desired resonant frequency. Parallel capacitor Cparellel2 326 is selected to tune out the reactance of the antennas inductance Ltxcoil3 324 at the desired resonant frequency. The transformer 350 better isolates the amplifier 300 from reflections and establishes a stable signal that has N times (for a 1:N transformer) the voltage across Ltxcoil3 324 vs voltage across Ltxcoil2 (in FIG. 2). The topology of amplifier 300 is especially important for industrial applications and very loose coupling resonant inductive systems because it includes all the benefits discussed above in relation to amplifier 200 of FIG. 2 but can also more readily scale the flux linkage between the transmitter and receiver(s) by increasing the turn ratios of the transformer 350. That is, amplifier 300's configuration can allow for easier scaling of the power delivered to the receiver for high power application and/or deliver more power at a further distance for an increased charging distance application.

Figure 4:
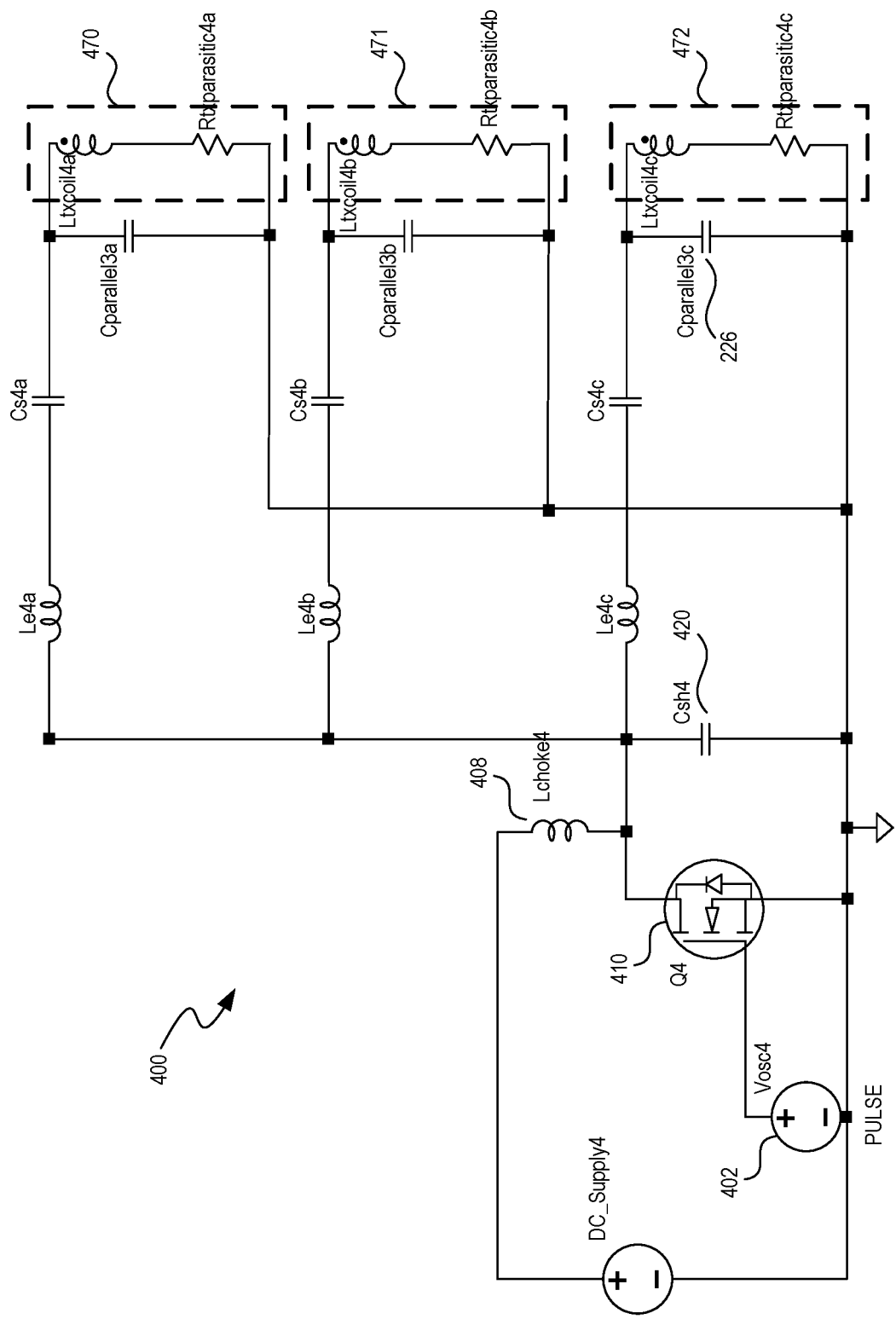
FIG. 4 shows a representative schematic of a parallel tuned class E amplifier configured for multiple antennas.

FIG. 4 shows a representative schematic of a parallel resonant class E amplifier 400 configured for multiple transmitter antennas. For example, the amplifier 400 can be integrated in a transmitter configured to drive multiple transmitter antennas, such as in a three-dimensional array, to increase the charging coverage of the wireless charging system. In some embodiments, such as depicted in FIG. 4, amplifier 400 can be configured to drive three transmitter antennas represented by equivalent circuits 470, 471, and 472. Like in amplifier 200 of FIG. 2, or amplifier 300 of FIG. 3, Lchoke4 408 and Csh4 420 are placed to tune the ZVS at resonance. However, amplifier 400 also includes additional series inductor (Le) components and series capacitor (Cs) components for each transmitter antenna introduced into the system, for example, Le4a, Le4b, Le4c, Cs4a, Cs4b, and Cs4c respectively for the three-antenna system depicted in FIG. 4. These additional Le and Cs components are configured to set the current and voltage waveforms out of phase and achieve ZVS. Additionally, the values are selected so that their reactance tune out at the desired resonant frequency (i.e., the frequency of each LC tank and the pulse voltage generated by Vosc4 402 and applied to the gate of transistor 410). Like in amplifier 200 of FIG. 2, the Le and Cs components act as resonant filters, reducing harmonics and creating better isolation from reflections to each antenna's LC tank. In some embodiments, the transmitter can employ one or more transmitter antennas and the receiver can employ multiple receiver antennas, where the number of transmitter antennas and the number of receiver antennas need not be equal.

Like in the amplifier 200 of FIG. 2 or the amplifier 300 of FIG. 3, amplifier 400's performance (e.g., power efficiency) is not substantially degraded under no load conditions or when the receivers are not present. Furthermore, in amplifier 400, the same voltage is applied to each resonant LC tank. That is, the voltages across Ltxcoil4a, Ltxcoil4b, and Ltxcoil4c are all identical, so there is more opportunity for receivers to couple stronger with the transmitter without sacrificing overall performance as is the case for single transmitter antenna systems like the embodiments described in relation to FIGS. 2 and 3 above. Additionally, with the topology of amplifier 400, multiple amplifiers are not needed for multiple transmitter antennas. Additional transmitter antennas can be introduced to the system for different applications, for example, automotive, consumer electronics, and aerospace applications, while maintaining low implementation cost because the same amplifier can drive each transmitter antenna with the primary loss just being the parasitic resistance of the antennas Rtxparasitic4a, Rtxparasitic4b, and Rtxparasitic4c, which especially for a high Q system is very low.

In some embodiments, the transmitter antennas are not identical. In these embodiments, amplifier 400 is configured to tune out the value of the antennas' equivalent inductance at the desired resonant frequency by Cparallel in the transmitter antenna branch. In other embodiments, a transformer (such as transformer 350 of FIG. 3) can be added to amplifier 400 for every transmitter antenna introduced to scale the oscillating voltages across each transmitter antenna thereby increasing the power delivered to the receiver and/or increasing the charging distance. In some embodiments, the turns ratio for the transformers corresponding to different antenna branches can be selected to be different so that each transmitter antenna has a different oscillating voltage resulting in the flux linkage varying for different transmitter antennas connected to the same amplifier system.

Figure 5:
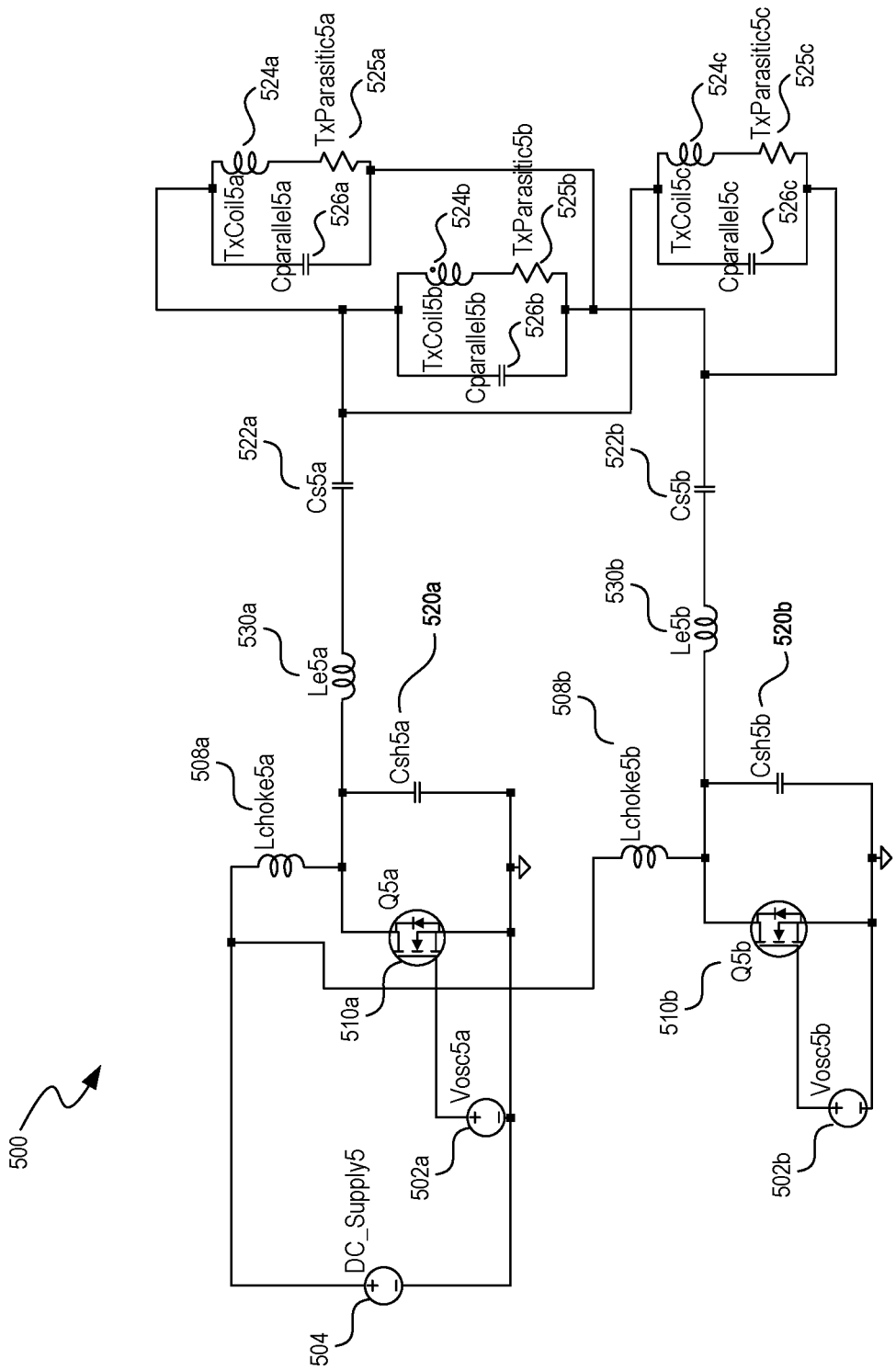
FIG. 5 shows a representative schematic of a parallel tuned class E amplifier configured for multiple antennas in differential mode.

FIG. 5 shows a representative schematic of a parallel resonant Class E amplifier 500 configured for multiple transmitter antennas in differential mode. In differential mode, a Class E amplifier can include two transistors (e.g., transistor Q5a 510a and transistor Q5b 510b) tuned for ZVS with two separate load networks that drive the transmitter antennas differentially. A first pulse is coupled the gate of transistor Q5a 510a from a pulse generator 502a and a complementary pulse is coupled to the gate of transistor Q5b 510b from a pulse generator 502b. As described above in relation to FIG. 2, the pulses can be generated by an oscillator or an integrated circuit square wave signal generator represented by Vosc5a 502a and Vosc5b 502b. Applying a pulse to the gate of transistor Q5b 510b that is an inverse (or complement, or around 180 degrees out of phase) to the pulse applied to the gate of transistor Q5a 510a, results in a differential signal coupled across each transmitter coil (e.g., coils represented by Txcoil5a 524a, Txcoil5b 524b, and Txcoil5c 524c). For example, Vosc5a 502a and Vosc5b 502b can generate a 6.78 MHz square wave alternating between 0 and 5V to drive the gate of the switching transistors 510a and 510b where the switching transistors Q5a 510a and Q5b 510b are turned on/off during separate intervals. That is, when Q5a 510a is closed or driven at 5V by Vosc5a 502a, then Q5b 510b is open or driven at 0V by Vosc5b 502b. In some embodiments, the complementary pulse signals (e.g., square wave signals) can be generated by separate oscillator integrated circuits. In other embodiments, a single oscillator integrated circuit or pulse generator can generate a single pulse that is coupled to logic circuitry (e.g., NAND/AND gates, inverters, etc.) to provide the complementary signals to drive transistor Q5a 510a and Q5b 510b. By driving the antennas differentially, the amplifier 500 can double the gain across each transmitter antenna in the system. Additionally, unlike a typical differential Class E amplifier that is tuned series-resonant with an off-resonant load network, the described embodiment of a differential parallel resonant topology provides the additional benefits described above in relation to FIG. 2.

Like in amplifier 200 of FIG. 2, or amplifier 300 of FIG. 3, or amplifier 400 of FIG. 4, choke inductor Lchoke5a 508a and shunt capacitor Csh5a 520a are configured to tune the ZVS at resonance for transistor Q5a 510a. Furthermore, in order to apply the signals differentially to the transmitter coils, choke inductor Lchoke5b 508b and shunt capacitor Csh5b 520b are configured to tune the ZVS at resonance for transistor Q5b 510b. Amplifier 500 includes additional series inductors (e.g., Le5a 530a, and Le5b 530b) and series capacitors (e.g., Cs5a 522a, and Cs5b 522b), which, unlike the embodiments described in relation to FIG. 4, are selected for each differential line rather than each antenna introduced into the system. That is, in some embodiments, Le5a 530a, Le5b 530b, Cs5a 522a, and Cs5b 522b are configured for the differential system depicted in FIG. 5, to set the current and voltage waveforms out of phase to achieve ZVS for both differential lines. Additionally, the values are selected so that their reactances tune out at the desired resonant frequency (i.e., the frequency of each LC tank and the pulse voltage generated by Vosc5a 502a and applied to the gate of Q5a transistor 510a). However, since the circuit depicted in FIG. 5 embodies a differential topology, the load network for the second transistor Q5b 510b can be selected such that the reactances are also tuned out at the desired resonant frequency like the load network of the first transistor Q5a 510a (i.e., at the frequency of the pulse generated by Vosc5b 502b and applied to the gate of the Q5b transistor 510a). Like in amplifier 200 of FIG. 2, or amplifier 300 of FIG. 3, or amplifier 400 of FIG. 4, the Le and Cs components act as resonant filters, reducing harmonics and creating better isolation from reflections to each antenna's LC tank.

Like in the amplifier 200 of FIG. 2, the amplifier 300 of FIG. 3, or amplifier 400 of FIG. 4, amplifier 500's performance (e.g., power efficiency) is not substantially degraded under no load conditions or when the receivers are not present. Furthermore, in amplifier 500, the same voltage is applied to each resonant LC tank like that of amplifier 400 in FIG. 4. That is, the voltages across equivalent inductors Txcoil5a 524a, Txcoil5b 524b, and Txcoil5c 524c are all identical, so there is more opportunity for receivers to couple stronger with the transmitter without sacrificing overall performance as is the case for single transmitter antenna systems like the embodiments described in relation to FIGS. 2 and 3. However, at the same input voltage, the differential signal of amplifier 500 doubles the oscillating voltage across each transmitter antenna compared to amplifier 400. This can increase the amount of power delivered and/or the charging distance when amplifier 500 is used in a wireless charging system. Additionally, like the topology of amplifier 400, using amplifier 500 eliminates the need for multiple amplifiers for multiple transmitter antennas. Additional transmitter antennas can be introduced to the system for different applications, for example, automotive, consumer electronics, and aerospace applications, while maintaining low implementation cost because the same amplifier can drive each transmitter antenna, with the main loss being the parasitic resistance of the antennas Txparasitic5a 525a, Txparasitic5b 525b, and Txparasitic5c 525c. These parasitic resistances are small, especially for a high Q system.

In some embodiments, the transmitter antennas (represented by Txcoil5a, Txcoil5b and Txcoil5c and TxParasitic5a, TxParasitic5b, TxParasitic5c) are not identical. In these embodiments, amplifier 500 is configured to tune out the value of the antennas' equivalent inductance at the desired resonant frequency by parallel capacitor Cparallel in the transmitter antenna branch (e.g., Cparallel5a 526a in the first branch, Cparallel5b 526b in the second branch, and Cparallel5c 526c in the third branch). In other embodiments, a transformer (such as transformer 350 of FIG. 3) can be added to amplifier 500 for every transmitter antenna introduced to scale the oscillating voltages across each transmitter antenna thereby increasing the power delivered to the receiver and/or increasing the charging distance. In some embodiments, the turns ratio for the transformers corresponding to different antenna branches can be selected to be different so that each transmitter antenna has a different oscillating voltage resulting in the flux linkage varying for different transmitter antennas connected to the same amplifier system.

In some embodiments, Csh5a 520a and Csh5b 520b can be selected to be 180 pF, Le5a 530a and Le5b 530b can be selected to be 7 μH, Cs5a 522a and Cs5b 522b can be selected to be 78.7 pF, Cparallel5a/b/c (526a, 526b, 526c) can be selected to be 551 pF, and Lchoke5a 508a and Lchoke5b 508b can be selected to be 600 nH for an amplifier 500 with antennas with an inductance of 1 μH and a series parasitic resistance 0.1 Ohms. Vosc5a 502a and Vosc5b 502b can generate complementary 6.78 MHz square waves alternating between 0 and 5V to drive the gate of the switching transistor Q5a 510a approximately 180 degrees out of phase with the signal driven to the gate of the switching transistor Q5b 510b. A 20 V dc supply 504 can drive the drains of the switching transistors 510a and 510b through the 600 nH choke inductors Lchoke5a and Lchoke 5b, respectively.

Figure 6:
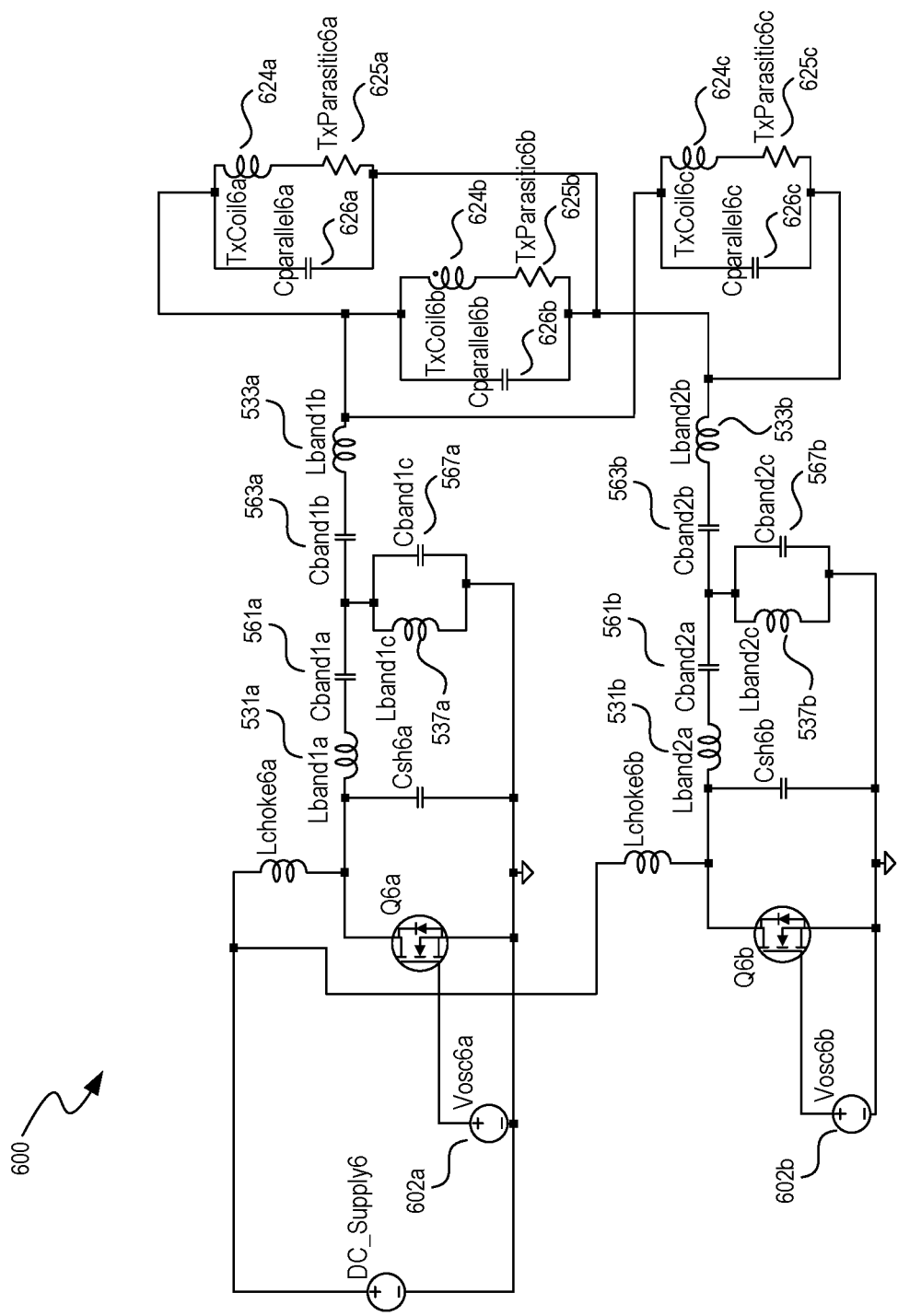
FIG. 6 shows a representative schematic of a parallel tuned class E amplifier configured for multiple antennas in differential mode with a bandpass filter.

FIG. 6 shows a representative schematic of a parallel resonant Class E amplifier 600 with a bandpass filter instead of a series filter for each differential line. In some embodiments, instead of a series filter for each differential line (e.g., the series filter comprising Le5a 530a and Cs5a 522a in FIG. 5), three inductors Lband1a 531a, Lband1b 533a, Lband1c 537a and three capacitors Cband1a 561a, Cband1b 563a, and Cband1c 567a. Each inductor in the bandpass filter is tuned at the same resonant frequency as the system (i.e. the frequency of each LC tank and the pulse voltage generated by Vosc6a 602a and Vosc6b 602b) with each capacitor in the bandpass filter. For example, Lband1a 531a is tuned to resonate with Cband1a 561a, Lband1b 533a is tuned to resonate with Cband1b 563a, and Lband1c 537a is tuned to resonate with Cband1c 567a. Compared to the series filter in the previous embodiments of the disclosed technology, the bandpass filter provides greater attenuation to the harmonics of the fundamental frequency for the amplifier. This can be important for electromagnetic compatibility or electromagnetic interference (EMC/EMI) compliance when greater attenuation for a project is desired. In some embodiments, when compared to the embodiments with the resonant series filters (e.g., filter comprising Le2 and Cs2 in FIG. 2), the bandpass filter can attenuate the harmonics of the fundamental frequency by 30 dB or more.

For example, in some embodiments, Lband1a and Lband1b can be 7 uH, and Cband1a and Cband1b can be 79 pF. Meanwhile, Lband1c can be 0.7 uH, and Cband1c can be 787 pF. All inductors in the bandpass filters can simultaneously resonate at 6.78 MHz, which, in this example, is the same resonant frequency as the entire amplifier (i.e. the frequency of each LC tank, etc.). Additionally, Lband2a 531b and Lband2b 533b can be 8 uH; Cband2a 561b and Cband2b 563b can be 69 pF; Lband2c can be 0.8 uH, and Cband2c can be 689 pF. Txcoil6a 624a, Txcoil6b 624b and Txcoil6c 624c can be 1 uH; TxParasitic6a 625a, TxParasitic6b 625b, and TxParasitic6c 625c can be 0.1 Ohms. Cparallel6a 626a, Cparallel6b 626b, and Cparallel6c 626c can be 551 pF. The remaining components, e.g., Lchoke6a, Lchoke6b, Csh6a, Csh6b, etc., can have the same values as in the example of FIG. 5.

That is, the band pass filter can comprise a first inductor (Lband1a 531a), a second inductor (Lband1b 533a), a third inductor (Lband1c 537a), a first capacitor (Cband1a 561a), a second capacitor (Cband1b 563a), and a third capacitor (Cband1c 567a). The first inductor is the series inductor of the series filter embodiments (e.g., inductor Le5a 530a of FIG. 5), the first capacitor is the series capacitor of the series filter embodiments (e.g., capacitor Cs5a 522a of FIG. 5). Additionally, in some embodiments second inductor is configured with an inductance value substantially equal to an inductance of the first inductor (e.g., both 7 uH) and the second capacitor is configured with a capacitance value substantially equal to a capacitance of the first capacitor (e.g., both 79 pF). The third inductor (e.g., 0.7 uH) and the third capacitor (e.g., 787 pF) are coupled in parallel forming an LC tank, coupled to the first capacitor and the second capacitor, and coupled to the source node of the switching transistor (which is coupled to ground).

When using the bandpass filters, the output substantially reduces the harmonics at 6.78 MHz in comparison to the series resonant filter. It will be appreciated that other filters can be used as substitutes to the bandpass filters, such as other types of Pi filters. These alternative filter topologies can be utilized instead of the series resonate filters (Le and Cs) described in relation to the amplifier embodiments of FIGS. 2, 3, 4 and 5, where additional attenuation for the harmonics of the amplifier is required.

Remarks

Unless the context clearly requires otherwise, throughout the description and the claims, the words "comprise," "comprising," and the like are to be construed in an inclusive sense, as opposed to an exclusive or exhaustive sense; in the sense of "including, but not limited to." As used herein, the terms "connected," "coupled," or any variant thereof means any connection or coupling, either direct or indirect, between two or more elements; the coupling or connection between the elements can be physical, logical, or a combination thereof. Additionally, the words "herein," "above," "below," and words of similar import, when used in this application, refer to this application as a whole and not to any particular portions of this application. Where the context permits, words in the above Detailed Description using the singular or plural number may also include the plural or singular number respectively. The word "or" in reference to a list of two or more items covers all of the following interpretations of the word: any of the items in the list, all of the items in the list, and any combination of the items in the list.

The above Detailed Description of examples is not intended to be exhaustive or to limit the invention to the precise form disclosed above. While specific examples for the embodiments are described above for illustrative purposes, various equivalent modifications are possible, as those skilled in the relevant art will recognize. For example, while processes or blocks are presented in a given order, alternative implementations can perform routines having steps/blocks, or employ systems having blocks, in a different order, and some processes or blocks can be deleted, moved, added, subdivided, combined, and/or modified to provide alternative or subcombinations. Each of these processes or blocks can be implemented in a variety of different ways. Also, while processes or blocks are at times shown as being performed in series, these processes or blocks can instead be performed or implemented in parallel, or can be performed at different times. Further any specific numbers noted herein are only examples: alternative implementations can employ differing values or ranges.

The teachings provided herein can be applied to other systems, not necessarily the system described above. The elements and acts of the various examples described above can be combined to provide further implementations of the invention. Some alternative implementations of the invention can include not only additional elements to those implementations noted above, but also can include fewer elements.

Any patents and applications and other references noted above, including any that may be listed in accompanying filing papers, are incorporated herein by reference. Aspects of the invention can be modified, if necessary, to employ the systems, functions, and concepts of the various references described above to provide yet further implementations of the invention. When statements or subject matter in an incorporated by reference conflict with statements or subject matter of this application, then this application shall control.

These and other changes can be made to the invention in light of the above Detailed Description. While the above description describes certain examples of the invention, and describes the best mode contemplated, no matter how detailed the above appears in text, the invention can be practiced in many ways. Details of the system can vary considerably in its specific implementation, while still being encompassed by the invention disclosed herein. As noted above, terminology used when describing certain features or aspects of the invention should not be taken to imply that the terminology is being redefined herein to be restricted to any specific characteristics, features, or aspects of the invention with which that terminology is associated. In general, the terms used in the following claims should not be construed to limit the invention to the specific examples disclosed in the specification, unless the above Detailed Description section explicitly defines such terms. Accordingly, the actual scope of the invention encompasses not only the disclosed examples, but also all equivalent ways of practicing or implementing the invention under the claims.

To reduce the number of claims, certain aspects of the invention are presented below in certain claim forms, but the applicant contemplates the various aspects of the invention in any number of claim forms. For example, certain aspects of the disclosed system be embodied as a means-plus-function claim, or in other forms, such as being embodied in a computer-readable medium. (Any claims intended to be treated under 35 U.S.C. § 112(f) will begin with the words "means for", but use of the term "for" in any other context is not intended to invoke treatment under 35 U.S.C. § 112(f).) Accordingly, the applicant reserves the right to pursue additional claims after filing this application to pursue such additional claim forms, in either this application or in a continuing application.

I claim:

1. An amplifier for amplifying a periodic signal, comprising:
   a switching transistor comprising a gate node, a source node coupled to a ground node, and a drain node, wherein the gate node is configured to receive the periodic signal;
   a dc bias circuit configured to bias the drain node of the switching transistor, wherein the dc bias circuit is coupled to the drain node through a choke inductor;
   a shunt capacitor coupled between the source node and the drain node of the switching transistor;
   a series inductor coupled between the drain node of the switching transistor and a first terminal of a series capacitor; and
   a parallel capacitor coupled to a second terminal of the series capacitor, and coupled in parallel to an antenna, wherein the antenna comprises an equivalent inductance in series with an equivalent resistance,
   wherein the choke inductor, a parasitic capacitance of the switching transistor, the shunt capacitor, the series inductor, the series capacitor, the parallel capacitor, and the antenna are configured to resonate at a fundamental frequency of the periodic signal received at the gate node of the switching transistor,
   wherein the parallel capacitor is configured with a capacitance value to resonate with the equivalent inductance of the antenna at the fundamental frequency of the periodic signal.

2. The amplifier of claim 1, wherein the series capacitor is configured with a capacitance value to cause the series capacitor to substantially resonate with the series inductor at the fundamental frequency of the periodic signal.

3. The amplifier of claim 1, wherein the amplifier comprises at least one of a single-ended or a differential mode class E amplifier.

4. The amplifier of claim 1, wherein the choke inductor is configured with an inductance value to cause a parasitic capacitance of the switching transistor and the shunt capacitor to substantially resonate.

5. The amplifier of claim 1, wherein the series capacitor and the parallel capacitor are tuned to a conjugate match with the antenna for an off-resonant load network.

6. The amplifier of claim 1, further comprising a transformer coupled to the parallel capacitor and the series capacitor, wherein the transformer causes a voltage amplitude across the antenna to scale in proportion to a turn ratio of a primary winding and a secondary winding of the transformer.

7. The amplifier of claim 6, further comprising a first capacitor in parallel with the primary winding of the transformer, and a second capacitor in series with the secondary winding of the transformer, wherein the first capacitor is configured to substantially resonate with the primary winding of the transformer at the fundamental frequency of the periodic signal, and the second capacitor is configured to substantially resonate with the secondary winding of the transformer at the fundamental frequency of the periodic signal.

8. The amplifier of claim 1, further comprising:
   a plurality of series inductors coupled between the drain node of the switching transistor and respectively a first terminal of a plurality of series capacitors;
   a plurality of antennas, wherein each one of the antennas comprises an equivalent inductance in series with an equivalent resistance; and
   a plurality of parallel capacitors respectively coupled to a second terminal of the plurality of series capacitors and to the ground node, wherein each one of the plurality of parallel capacitors is coupled in parallel to a corresponding antenna's equivalent inductance and equivalent resistance.

9. The amplifier of claim 8, wherein at least one of the antennas has a different equivalent inductance from the remainder of the antennas.

10. The amplifier of claim 8, wherein each one of the parallel capacitors is configured with a capacitance value to substantially resonate a corresponding equivalent inductance of a corresponding antenna.

11. The amplifier of claim 8, further comprising a plurality of transformers coupled to the plurality of parallel capacitors and the second terminal of the plurality of series capacitors.

12. The amplifier of claim 11, wherein at least one of the transformers is configured with a turns ratio that is different from a turns ratio of the remainder of the transformers.

13. The amplifier of claim 1, further comprising:
   a second switching transistor comprising a second gate node, a second source node coupled to the ground node, and a second drain node, wherein the second gate node is configured to receive a signal that is around 180 degrees out of phase with the periodic signal;

a second dc bias circuit configured to bias the second drain node of the second switching transistor, wherein the second dc bias circuit is coupled to the second drain node through a second choke inductor;

a second shunt capacitor coupled between the second source node and the second drain node of the second switching transistor; and a second series inductor coupled between the second drain node of the second switching transistor and a first terminal of a second series capacitor, wherein the parallel capacitor is coupled to the second terminal of the series capacitor and to a second terminal of the second series capacitor, and coupled in parallel to the antenna.

14. The amplifier of claim 13, further comprising a plurality of antennas, each one of the plurality of antennas coupled to the second terminal of the series capacitor and the second terminal of the second series capacitor, and each one of the plurality of antennas coupled in parallel to the antenna.

15. The amplifier of claim 13, further comprising:
a first inductor coupled in series to a first terminal of a first capacitor, wherein the first inductor is the series inductor and the first capacitor is the series capacitor, and the first inductor and the first capacitor are configured to substantially resonate at the fundamental frequency of the periodic signal;
a second terminal of a second inductor coupled to the parallel capacitor and a first terminal of the second inductor coupled in series to a second terminal of a second capacitor, wherein the second inductor and the second capacitor are configured to substantially resonate at the fundamental frequency of the periodic signal; and,
a third inductor coupled in parallel to a third capacitor, wherein the third inductor and the third capacitor are configured to substantially resonate at the fundamental frequency of the periodic signal, and
wherein a first terminal of the third inductor and a first terminal of the third capacitor are coupled to a second terminal of the first capacitor and a first terminal of the second capacitor, and a second terminal of the third inductor and a second terminal of the third capacitor are coupled to the source node of the switching transistor.

16. The amplifier of claim 1, further comprising:
a parallel inductor coupled to the second terminal of the series capacitor, and coupled in parallel with the parallel capacitor,
a second series capacitor coupled between the second terminal of the series capacitor and a first terminal of a second series inductor,
wherein the parallel inductor, the second series capacitor, and the second series inductor are configured to resonate at the fundamental frequency of the periodic signal.

17. A method for amplifying a periodic signal for driving an antenna, the method comprising:

switching a switching transistor on or off in response to receiving the periodic signal at a gate of the switching transistor;

biasing, through a choke inductor, a drain of the switching transistor at a dc bias level;

adjusting a voltage and a current waveform of the switching transistor, the voltage and current waveforms generated in response to switching the switching transistor on or off, to reduce temporal overlap of the voltage and current waveforms, wherein the adjusting is in response to substantially resonating the choke inductor and a series inductor coupled to the drain of the switching transistor with a capacitor shunting the drain to a ground node;

filtering harmonic components of the periodic signal using a filter; and substantially resonating, at a fundamental frequency of the periodic signal received at the gate of the switching transistor, the choke inductor, a parasitic capacitance of the switching transistor, the capacitor shunting the drain of the switching transistor to the ground node, the series inductor, a series capacitor, a capacitor in parallel with the antenna, and the antenna.

18. The method of claim 17, further comprising scaling a voltage amplitude across the antenna by a factor of N by coupling a voltage transformer comprising a 1:N turns ratio between the series capacitor and the antenna.

19. A wireless charging system, comprising:
a signal generator circuit configured to generate a periodic signal;
an antenna, comprising an equivalent inductance and an equivalent resistance; and
an amplifier coupled to the signal generator circuit and to the antenna, and configured to amplify the periodic signal, wherein the amplifier comprises:
a switching transistor comprising a gate node coupled to the signal generator circuit, a source node coupled to a ground node, and a drain node, wherein the gate node is configured to receive the periodic signal generated by the signal generator circuit;
a dc bias circuit configured to bias the drain node of the switching transistor, wherein the dc bias circuit is coupled to the drain node through a choke inductor;
a shunt capacitor coupled between the source node and the drain node of the switching transistor;
a series inductor coupled between the drain node of the switching transistor and a first terminal of a series capacitor; and,
a parallel capacitor coupled to a second terminal of the series capacitor and to the ground node, and coupled in parallel to the antenna's equivalent inductance and equivalent resistance,
wherein the choke inductor, a parasitic capacitance of the switching transistor, the shunt capacitor, the series inductor, the series capacitor, the parallel capacitor, and the antenna are configured to resonate at a fundamental frequency of the periodic signal received at the gate node of the switching transistor.

* * * * *